United States Patent
Maricevic et al.

(10) Patent No.: US 8,145,068 B2
(45) Date of Patent: Mar. 27, 2012

(54) DUAL USE OF TEST POINT POWER MONITOR

(75) Inventors: Zoran Maricevic, West Hartford, CT (US); Eric Cormier, Southington, CT (US); Benedict J. Jackson, Beaverton, OR (US); Jayesh Bhatt, Windsor, CT (US); Marcel F Schemmann, Marea Hoop (NL); Zhijian Sun, Avon, CT (US)

(73) Assignee: ARRIS Group, Inc., Suwanee, GA (US)

(*) Notice: Subject to any disclaimer, the term of this patent is extended or adjusted under 35 U.S.C. 154(b) by 410 days.

(21) Appl. No.: 12/406,107

(22) Filed: Mar. 17, 2009

(65) Prior Publication Data

US 2009/0263141 A1 Oct. 22, 2009

Related U.S. Application Data

(60) Provisional application No. 61/069,790, filed on Mar. 17, 2008.

(51) Int. Cl.
*H04B 10/04* (2006.01)

(52) U.S. Cl. ........ 398/197; 398/195; 398/192; 398/156; 398/30; 398/33; 398/38

(58) Field of Classification Search .................. 398/156, 398/197, 195, 192, 30, 33, 38
See application file for complete search history.

(56) References Cited

U.S. PATENT DOCUMENTS

| | | | |
|---|---|---|---|
| 2003/0200548 A1* | 10/2003 | Baran et al. | 725/90 |
| 2005/0246756 A1* | 11/2005 | Leddy et al. | 725/129 |
| 2008/0175143 A1* | 7/2008 | Ansley | 370/221 |

* cited by examiner

*Primary Examiner* — Kinam Park
(74) *Attorney, Agent, or Firm* — Troy A. Van Aacken; Robert J. Starr

(57) ABSTRACT

A channel alignment system in an optical communication network includes logic to sample power of a quadrature amplitude modulation (QAM) channel at a component downstream from a QAM modulator. The system determines if the sampled channel power has a sufficient level. The system signals power control logic of the QAM modulator to adjust a gain of the sampled channel.

9 Claims, 1 Drawing Sheet

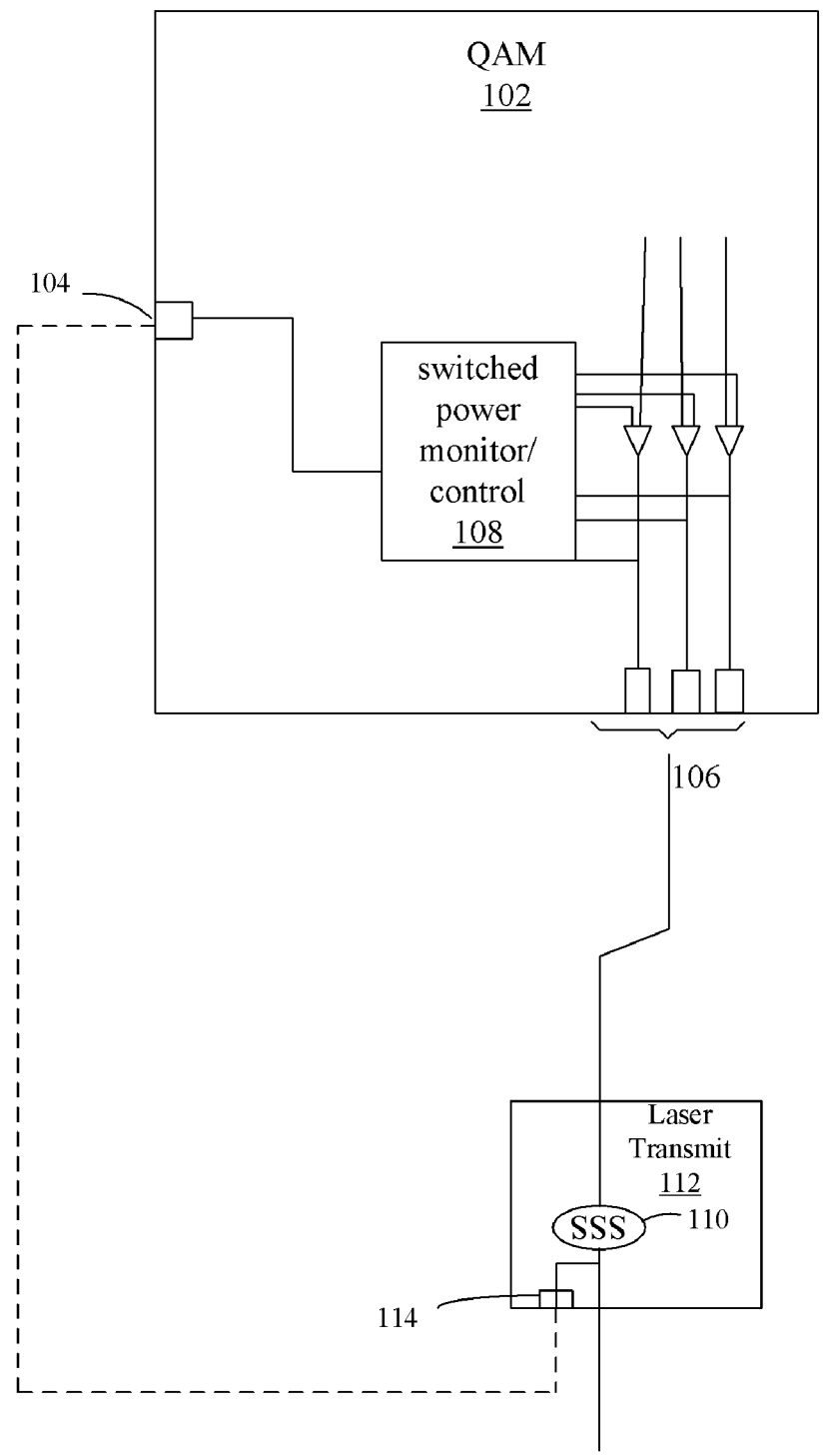

DUAL USE OF TEST POINT POWER MONITOR

PRIORITY CLAIM

The present application claims priority under 35 USC 119 to U.S. application No. 61/069,790 filed on Monday, Mar. 17, 2008, which is presently pending and which is incorporated herein by reference.

BACKGROUND

In cable television (CATV) networks, many network components (modulators, including quadrature amplitude modulation (QAM) modulators, transmitters, receivers, amplifiers) often provide a separate "test point" port, which is typically exclusively an output port, and typically not an input or dual input/output port. This test point is to verify levels at various frequencies, at a particular point in the CATV network, and thus to verify signal presence and the signal levels at various frequencies. This level verification process is typically done by hooking of a spectrum analyzer to a test point, in order to read levels/slope versus frequency. QAM modulators also can provide such a test point port.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

FIG. 1 illustrates an embodiment of a novel QAM modulator.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

A tunable power-detection block is designed into a QAM modulator product in order to read the power delivered to the test point. The resolution of the power-detection block may be by QAM channel, QAM output, or some other granularity. Modern Edge-QAM modulators may provide multiple RF outputs. The QAM may have a feature enabling selection of which output to power sample at the test point, and/or a feature to "round-robin" switch among the multiple outputs, at a rate of (for example) approximately several rounds per minute, in order to enable active monitoring of the test-point RF power and thus the power at corresponding RF outputs.

FIG. 1 illustrates an embodiment of a novel QAM modulator 102. Unlike prior designs, the test-point 104 does not merely passively monitor the outputs 106 of the QAM modulator 102. Instead, the QAM modulator 102 comprises a switched power monitor/control 108 which can selectively tune to different QAM outputs 106 and channels within outputs. The power block 108 may also control the QAM channel power amplifiers 116. Power block 108 may selectively tune the different channels of the various QAM outputs 106 and provide an indication of the power on those tuned channels to test port 104. Thus the power of particular QAM channels may be monitored at the test port 104 without the use of a spectrum analyzer and may be provided to other components of the system including control components. These control components may employ the test port 104 as an input to the switched power monitor 108 to control the gain of channel power amplifier 116. Thus, the test port 104 functions not only as an intelligent output monitoring power monitor port, but also as a power control input port.

FIG. 1 further illustrates an exemplary channel power control system in which the downstream components, such as laser transmitter 112 comprising a laser 110, may be employed to perform channel power alignment. The laser transmitter 112 may provide an indication of the power of a particular QAM channel as its output 114. This signal may be fed back to test point 104 of the QAM 102. The power block 108 or an intermediate component may determine whether the power of the channel is sufficient at the downstream component 112. If the power at the downstream components is not sufficient, a boost in the power of that channel may be provided by the power block 108 controlling the tunable amplifier 116 for the power deficient channel, thus boosting the power of that channel at QAM output 106. This boosting power may propagate down to the component, such as laser transmitter 112, resulting in an increasing power measured at output 114.

The increased power indication will once again be fed back to test point 104 possibly resulting in further adjustments to the power of the channel, until such time as the power of the channel comes within acceptable limits. Power monitoring and control may vary by implementation. In some implementations, tuning control may be at a resolution of the QAM output 106. In other embodiments, power monitoring and control may be at the resolution of particular QAM channels within the QAM output 106. The number of said channels may vary according to implementation and geography.

The power-detection block may be coupled via RF switches to the test-point in such a way that a signal may be routed from another point in the CATV network, via RF cable, into the QAM modulator test-point in order to detect/sense presence of RF power from one of the QAM modulator outputs at the desired point in the CATV network. Oftentimes, that desired point in the network is the laser transmitter input and/or laser transmitter test point, where the QAM-modulator-originating-channels need to get leveled to the same RF level as all the other digital/QAM channels. Digital channels are most often aligned at 9 dBmV, which is −6 dB with respect to the analog channel levels, which are typically set at +15 dBmV level into the modern laser transmitters.

One embodiment of a QAM-channel alignment procedure is as follows:

a. Connect laser transmitter test point, via known-length, known-attenuation RF cable, to the QAM modulator test point; temporarily mute all the other inputs into the laser transmitter under alignment b. Enable "Level align" mode, either on the front panel of the QAM modulator, or in the graphical user interface of the QAM modulator. This mode disconnects RF outputs from reaching the test point and the power detection block (the "usual" test point mode), and switches/connects the power detection block to the test point side, into the "listen" mode.

c. Specify the connecting cable characteristics, typically its length and its loss versus frequency, in order for the alignment software to account/calibrate for the connecting cable effects.

d. Within the QAM modulator, selectively turn off and then back on different groups of output QAM channels.

e. Sense and record which QAM channels reach the laser-transmitter-under-alignment test point.

f. For the QAM channels that reach the laser transmitter under alignment, the QAM modulator control software performs alignment to a default RF level, typically 9 dBmV per QAM channel.

Aspects of the alignment procedure may be distributed all over the network. For example, the control actions that increase or decrease the QAM channel gain in the QAM modulator may be performed by network management software. Power detection may be built into the QAM modulator or the laser transmitter test point. An "Align" command, executed at the network management level, communicates with and controls the QAM modulator gain settings, based at least in part upon the laser-transmitter-based power detection block reading.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A quadrature amplitude modulation (QAM) modulator comprising:
   a physical test port comprising nontransitory logic to enable the test port to function as a tunable QAM signal power monitor port and also as a QAM signal power control port.

2. The QAM modulator of claim 1, further comprising:
   the tunable OAM signal power monitor of the physical test port has a QAM channel resolution.

3. The QAM modulator of claim 1, further comprising:
   the QAM signal power control of the physical test port has a QAM channel resolution.

4. The QAM modulator of claim 1, further comprising:
   the tunable QAM signal power monitor of the physical test port configured to round robin switch among multiple QAM channels in round-robin fashion.

5. A channel alignment system in an optical communication network, comprising:
   machine memory and/or circuits comprising nontransitory logic to operate a tunable QAM signal power monitor of a OAM modulator via a physical test port to sample power of a quadrature amplitude modulation (QAM) channel at a component downstream from the QAM modulator,
   machine memory and/or circuits comprising nontransitory logic to determine if the sampled channel power has a sufficient level;
   machine memory and/or circuits comprising nontransitory logic to signal power control logic of the QAM modulator via the physical test port to adjust a gain of the sampled channel.

6. The system of claim 5, further comprising:
   the downstream component is a laser transmitter having a channel power test port.

7. The system of claim 5, further comprising:
   the logic to determine if the sampled channel power has a sufficient level is external to both the downstream component and the QAM modulator.

8. The system of claim 5, further comprising:.
   the logic to determine if the sampled channel power has a sufficient level is comprised by the QAM modulator.

9. The system of claim 5, further comprising:
   the logic to determine if the sampled channel power has a sufficient level is comprised by the downstream component.

* * * * *